United States Patent [19]

Inoue et al.

[11] Patent Number: 5,019,874
[45] Date of Patent: May 28, 1991

[54] SEMICONDUCTOR DEVICE HAVING AN EPITAXIAL LAYER GROWN HETEROEPITAXIALLY ON AN UNDERLYING SUBSTRATE

[75] Inventors: Toshikazu Inoue, Yokohama; Takashi Eshita, Ohmorinishi, both of Japan

[73] Assignee: Fujitsu Limited, Kawasaki, Japan

[21] Appl. No.: 531,106

[22] Filed: May 31, 1990

[30] Foreign Application Priority Data

May 31, 1989 [JP] Japan .................................. 1-137865

[51] Int. Cl.$^5$ .......................................... H01L 29/161
[52] U.S. Cl. ...................................... 357/16; 357/30; 357/4
[58] Field of Search ...................... 357/30 E, 4, 16, 17

[56] References Cited

U.S. PATENT DOCUMENTS 4,680,602 7/1987 Watanabe et al. ................ 357/16 X
4,827,320 5/1989 Morkoc et al. ................... 357/16 X
4,918,496 4/1990 Matsushima et al. ............ 357/16 X

OTHER PUBLICATIONS

Hwang et al., "Effect of Strain on the Band Structure of GaAs and $In_{0.2}Ga_{0.8}As$", *Appl. Phys. Lett.* 52(4), Jan. 25, 1988, pp. 308–310.
Gourley et al., "Controversy of Critical Layer Thickness for InGaAs/GaAs Strained-Layer Epitaxy," *Appl. Phys. Lett.* 52(5), Feb. 1, 1988, pp. 377–379.

*Primary Examiner*—William Mintel
*Attorney, Agent, or Firm*—Staas & Halsey

[57] ABSTRACT

A semiconductor device comprises a first semiconductor layer made of a single crystal of a first semiconductor material having a first lattice constant, a second semiconductor layer comprising a single crystal of a second semiconductor material having a second lattice constant which is different from the first lattice constant, a third semiconductor layer made of a third semiconductor material having a third lattice constant which is different from the first lattice constant, the third semiconductor layer being grown heteroepitaxially on the first semiconductor layer, a fourth semiconductor layer made of a fourth semiconductor material having a fourth lattice constant which is different from the third lattice constant, the fourth semiconductor layer being grown heteroepitaxially on the third semiconductor layer in a manner such that the second semiconductor layer is provided thereon, for preventing a first group of dislocations created in the third semiconductor layer from reaching the second semiconductor layer after passing through the fourth semiconductor layer, the fourth semiconductor layer having a thickness chosen to be larger than a critical thickness above which thickness a second group of dislocations are created in the fourth semiconductor layer, the thickness of the fourth semiconductor layer being further optimized to an optimum thickness above which thickness and below which thickness there is caused an increase of the dislocation density in the second semiconductor layer, and an active semiconductor device provided on the second semiconductor layer.

11 Claims, 3 Drawing Sheets

SEMICONDUCTOR DEVICE HAVING AN EPITAXIAL LAYER GROWN HETEROEPITAXIALLY ON AN UNDERLYING SUBSTRATE

BACKGROUND OF THE INVENTION

The present invention generally relates to semiconductor devices and in particular to a semiconductor device constructed on an epitaxial layer of a first semiconductor material grown heteroepitaxially on a semiconductor substrate or wafer of a second semiconductor material.

The compound semiconductor material of the group III element and the group V element such as gallium arsenide (GaAs) is a promising material for the substrate of the next generation semiconductor devices because of the various advantageous properties pertinent to the material such as the high electron mobility, characteristic band structure which facilitates the emission and absorption of photons by the direct transition process and the like.

In order to mass produce the compound semiconductor devices cheaply, the technique to produce a large diameter substrate is essential. However, such a process is not established yet partly because of the difficulty of growing a large diameter bulk crystal of compound semiconductor materials with a satisfactory quality in respect to the composition, dislocation density and the uniformity of the crystal and partly because of the difficulty in handling the brittle wafers sliced from the bulk crystal ingot. Because of the foregoing reasons, an alternative technique to obtain a substrate of the compound semiconductor devices by growing a thin layer of the compound semiconductor material heteroepitaxially on a silicon wafer is studied. It should be noted that the fabrication technique and the handing process of a large diameter silicon wafer is well established.

In the latter approach, however, there arises a problem in that the epitaxial layer of the compound semiconductor layer grown on the silicon wafer contains a substantial amount of dislocations because of the difference in the lattice constant and the coefficient of thermal expansion between the compound semiconductor material and silicon. It should be noted that when such a difference exists in the lattice constant and thermal expansion, there appears a slip or misfit in the crystal lattices of silicon and the compound semiconductor material at the heterojunction interface, and such a misfit is propagated into the epitaxial layer as dislocations.

In order to reduce the dislocations in the compound semiconductor substrate, various approaches are proposed such as annealing the epitaxial layer together with the silicon wafer so as to relax the stresses developed at the heterojunction interface, interposing a strained super lattice layer between the silicon wafer and the epitaxial layer for intercepting the dislocations and the like. However, any of these approaches is so far unsuccessful in reducing the dislocation density at the top surface of the epitaxial layer which is used as the substrate of the compound semiconductor device, to the level below about $10^7$ cm$^{-2}$. This level of the dislocation density is unsatisfactory for the material to be used as the substrate of the semiconductor devices.

SUMMARY OF THE INVENTION

Accordingly, it is a general object of the present invention to provide a novel and useful semiconductor device having an epitaxial substrate layer grown heteroepitaxially on a semiconductor substrate wherein the foregoing problems are eliminated.

Another and more specific object of the present invention is to provide a semiconductor device having an epitaxial substrate layer grown heteroepitaxially on a semiconductor substrate wherein the dislocation density is reduced in the epitaxial substrate layer.

Another object of the present invention is to provide a semiconductor device comprising: a first semiconductor layer made of a single crystal of a first semiconductor material having a first lattice constant; a second semiconductor layer made of a single crystal of a second semiconductor material having a second lattice constant which is different from the first lattice constant; a third semiconductor layer made of a third semiconductor material having a third lattice constant which is different from the first lattice constant, said third semiconductor layer being grown heteroepitaxially on the first semiconductor layer, a fourth semiconductor layer made of a fourth semiconductor material having a fourth lattice constant which is different from the third lattice constant, said fourth semiconductor layer being grown heteroepitaxially on the third semiconductor layer in a manner such that the second semiconductor layer is provided thereon, for preventing a first group of dislocations created in the third semiconductor layer from reaching the second semiconductor layer after passing through the fourth semiconductor layer, said fourth semiconductor layer having a thickness chosen to be larger than a critical thickness above which thickness a second group of dislocations are created in the fourth semiconductor layer at an interface between the third semiconductor layer and the fourth semiconductor layer as a result of difference between the third lattice constant and the fourth lattice constant, said thickness of the fourth semiconductor layer being further optimized to an optimum thickness above which thickness and below which thickness there is caused an increase of the dislocation density in the second semiconductor layer; and an active semiconductor device provided on the second semiconductor layer.

According to the present invention, the first group dislocations creased at the boundary between the second semiconductor layer and the first semiconductor layer are cancelled each other in the third semiconductor layer by the interaction with the second group dislocations created intentionally at the interface between the second semiconductor layer and the third semiconductor layer, and thereby the number of the first group dislocations reaching the top surface of the third semiconductor layer is minimized. Further, as a result of the optimization of the thickness of the third semiconductor layer, the number of the second group dislocations which are created at the interface between the second insulator layer and the third insulator layer and reach the top surface of the third insulator layer without causing the interaction with the first group dislocations, is minimized. As a result, the dislocations are eliminated from the second semiconductor layer to a satisfactory level and thereby a desirable performance is guaranteed for the active semiconductor device provided on the second semiconductor layer. In a preferred embodiment, another layer for intercepting the first and second groups of dislocations may be interposed between the third semiconductor layer and the fourth semiconductor layer.

Other objects and further features of the present invention will become apparent from the following detailed description when read in conjunction with the attached drawings.

DETAILED DESCRIPTION

Figure 1:
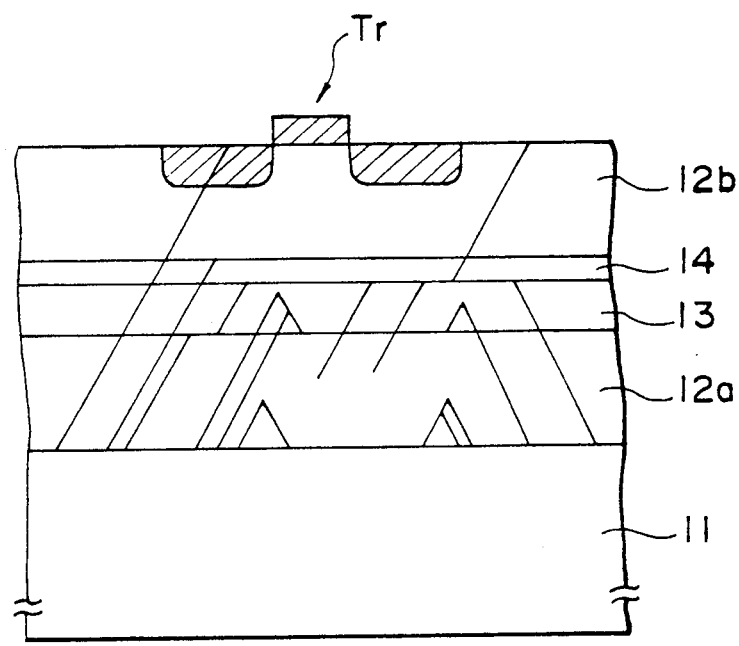
FIG. 1 is a cross-sectional view showing a first embodiment of the present invention.

FIG. 1 shows a first embodiment of the semiconductor device of the present invention which is constructed on a GaAs single crystal layer grown heteroepitaxially on a silicon substrate. It should be noted that GaAs has a lattice constant of 5.653 Å which is about 4% larger than that of silicon.

Referring to FIG. 1, the semiconductor device includes a silicon substrate 11 on which a first GaAs epitaxial layer 12a is grown heteroepitaxially for a thickness of about 1.5 μm by a metal-organic chemical vapor deposition (MOCVD) process using trimethylgallium (TMG) and arsine ($AsH_3$) as the source gas. In this process, an amorphous layer of GaAs not illustrated is grown at first on the silicon substrate 11 at a temperature of 450° C. for a thickness of about 100 Å, and the deposition of GaAs epitaxial layer 12a is made subsequently thereon at a temperature of 700° C. under an atmosphere of 76 Torr until the layer 12a reaches a thickness of about 0.5–2.0 μm, preferably a thickness about 1.5 μm.

On the GaAs layer 12a, a first buffer layer 13 of indium gallium arsenide (InGaAs) having a composition of $In_{0.05}Ga_{0.95}As$ is grown with a thickness of about 0.3–0.8 μm, preferably about 0.6 μm (6000 Å) using TMG, arsine and tetramethylindium (TMI) as the source gases at a temperature of 700° C. In a typical example, the growth is made under a pressure of 76 Torr with a flow rate of 14 SCCM for TMG held at 15° C., 100 SCCM for arsine held at 15° C. and 111 SCCM for TMI hled at 30° C. Further, a strained superlattice layer 14 is grown epitaxially on the first buffer layer 13 as a second buffer layer.

Figure 2:
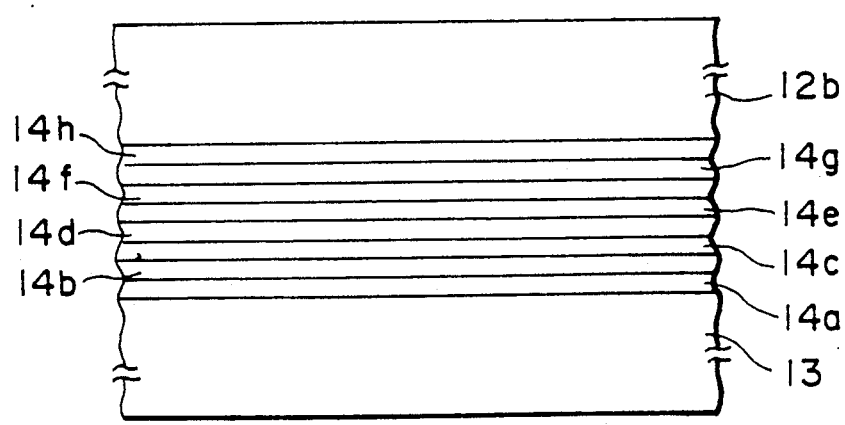
FIG. 2 is an enlarged cross-sectional view showing a part of the semiconductor device of FIG. 1.

FIG. 2 shows the structure of the second buffer layer 14. As shown in FIG. 2, the second buffer layer 14 comprises a number of alternating layers of about $In_{0.1}Ga_{0.9}As$ (14b, 14d, 14f and 14h) and GaAs (14a, 14c, 14e, 14g) each having a thickness of about 200 Å. The growth of the second buffer layer 14 may be made by repeating the growing process of the GaAs layer and the $In_{0.05}Ga_{0.95}As$ layer alternately for a number of times each with a duration of about 100 seconds. In the illustrated example, the super lattice layer has a thickness of about 200 Å. Thereby, there is formed a superlattice structure in the buffer layer 14. Because of the difference in the lattice constant between $In_{0.05}Ga_{0.95}As$ and GaAs, there is developed a stress at each interface between the layers 14a–14h forming the superlattice structure, and in response thereto, the buffer layer 14 forms a strained superlattice structure. On the second buffer layer 14, a second GaAs epitaxial layer 12b is grown until the overall thickness of the layers 12a, 13, 14 and 12b becomes about 4 μm. and an active semiconductor device Tr is formed on the second epitaxial GaAs layer 12b as schematically illustrated in FIG. 1.

The applicant of the present invention has conducted a study to investigate how the dislocation density at the top surface of the second epitaxial layer 12b changes in response to the thickness of the first buffer layer 13 by preparing a number of samples each having a different thickness of the first buffer layer 13. In the study, the dislocation density was measured by treating the surface of the GaAs epitaxial layer 12b by a solution of potassium hydroxide (KOH) and observing the number of the etch pits appearing on the top surface of the epitaxial layer 12b.

Figure 3:
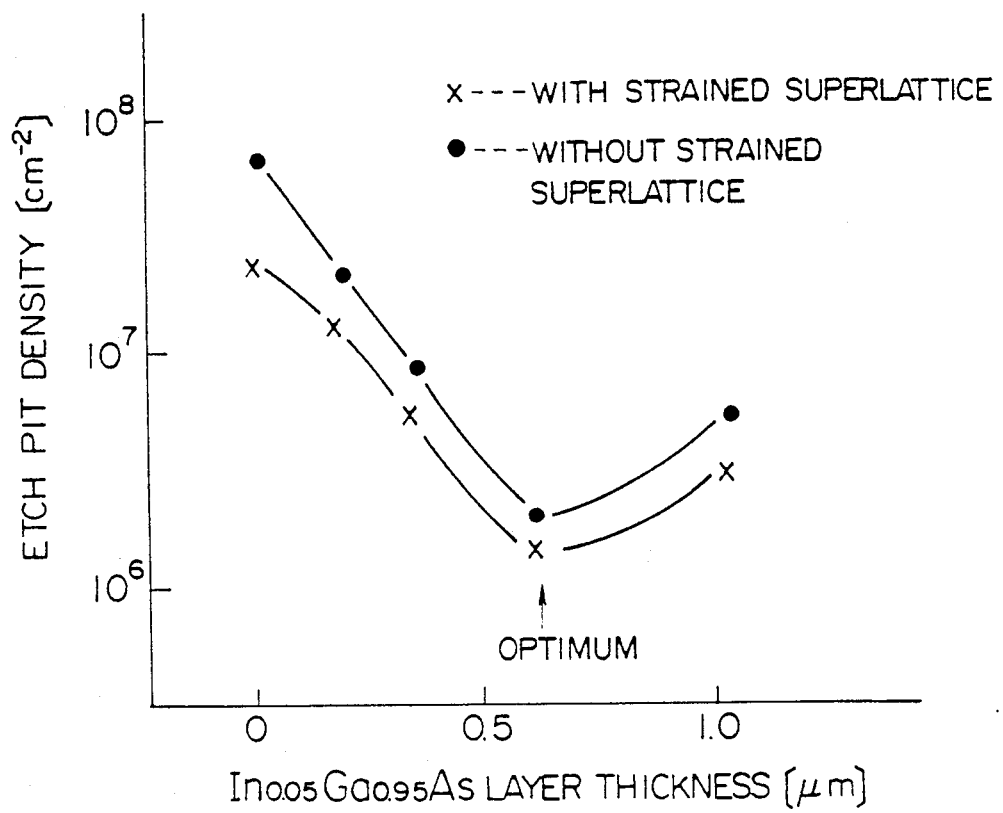
FIG. 3 is a graph showing the effect of decreasing the dislocation density achieved by the present invention.

FIG. 3 shows the result of the study in which the mark x represents the result obtained for the structure of FIG. 1. As can be seen from the drawing, there is a definite relationship between the dislocation density at the top surface of the GaAs epitaxial layer 12b and the thickness of the first buffer layer 13. More specifically, when there is no first buffer layer 13, the dislocation density at the top surface of the epitaxial layer 12b assumes a level substantially exceeding $10^7 cm^{-2}$ in correspondence to the zero thickness of the first buffer layer 13. With increasing thickness of the first buffer layer 13, it was found that the dislocation density at the top surface of the second GaAs epitaxial layer 12b is decreased and reaches a minimum value which is close to $10^6 cm^{-2}$ when the thickness of the first buffer layer 13 is about 0.6 μm. This decrease is more than one order in the magnitude. With a further increase of the thickness of the layer 13, the dislocation density starts to increase again. The foregoing finding clearly shows that there is an optimum thickness of the first buffer layer 13 at somewhere around 0.6 μm or 6000 Å.

This thickness of 6000 Å exceeds a critical thickness of the InGaAs crystal layer above which the misfit in the crystal lattice of $In_{0.05}Ga_{0.95}As$ with respect to the underlying layer of GaAs becomes too large to be absorbed by straining the crystal lattice without creating dislocations. In other words, there should be a number of dislocations in the first buffer layer 13 originating at the interface between the first GaAs epitaxial layer 12a and the first buffer layer 13. An example of calculation of the critical thickness is described by Matthews and Blackeslee (Matthews, J. W., Blackeslee, A. E., *Defects in Epitaxial Multilayers*, J.Crystal.Growth vol. 27, pp. 118–125. 1974).

According to Matthews and Blackeslee, the critical thickness of a crystal layer grown on another crystal layer is calculated, assuming an isotropic medium, according to the equation $$h_c = b/2\pi f(1-\nu \cos^2 \alpha)/(1+\nu) \cos \lambda \cdot (\ln h_c/b + 1)$$

where b stands for the strength of the dislocations, f stands for twice the maximum value of the strain, $\alpha$ stands for the angle between the dislocation line and its Burgers vector, $\lambda$ stands for the angle between the slip direction and the direction in the plane of the InGaAs layer which is perpendicular to the line of intersection of the slip plane and the interface, and $\nu$ stands for the Poisson's ratio. By substituting the parameters pertinent to the $In_{0.1}Ga_{0.9}As$ layer grown on the GaAs layer as $b=4.0$, $f=3.58\times10^{-3}$, $\cos\alpha=\frac{1}{2}$, $\cos\lambda=\frac{1}{2}$, $\nu=\frac{1}{3}$ and solving the foregoing equation, one obtains the critical thickness of 325 Å for the $In_{0.05}Ga_{0.95}As$ layer.

As the layer thickness of the first buffer layer 13 of about 6000 Å substantially exceeds the critical thickness of 325 Å, there are a number of dislocations formed in the first buffer layer 13. The existence of such dislocations are confirmed by the microscopic observation.

Because there are a number of dislocations in the first buffer layer 13, the dislocations called "threading dislocations" originating at the interface between the silicon substrate 11 and the GaAs epitaxial layer 12a and reaching the second GaAs epitaxial layer 12a are thought to be intercepted by the dislocations or "non-threading dislocations" created in the first buffer layer 13 at the interface between the layer 13 and the layer 12a. When these two different types of dislocations merge, it is expected that the misfit of the crystal lattice is cancelled. When this occurs, further extension of the threading dislocations to the top surface of the GaAs epitaxial layer 12b is prevented.

In the first embodiment of FIG. 1, the second buffer layer 14 is provided so as to intercept the non-threading dislocations which are not cancelled by merging with the threading dislocations. These dislocations are deflected by the strained super lattice structure of the buffer layer 14 and are trapped at the interface between the layers 14a–14h forming the strained superlattice structure. Thereby, the dislocation density in the order of $10^6 cm^{-2}$ is achieved in the second GaAs epitaxial layer 12b as illustrated in FIG. 3.

Because of the reduction of the dislocation density in the GaAs epitaxial layer 12b, the active device Tr provided on the GaAs epitaxial layer 12b as shown in FIG. 1 operates satisfactorily.

Figure 4:
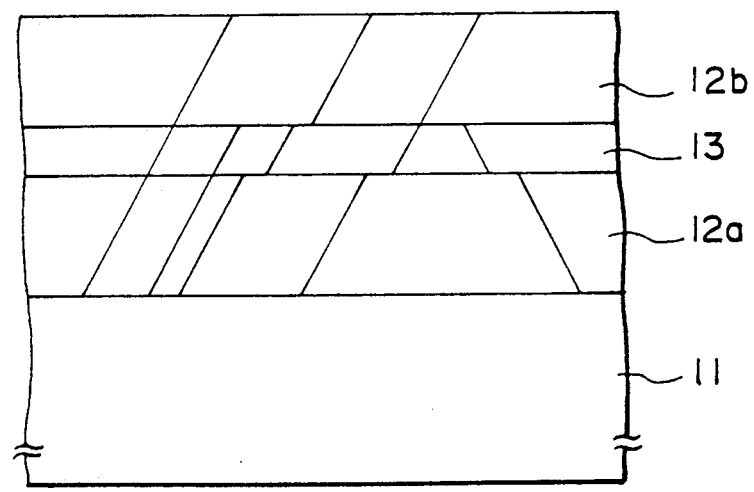
FIG. 4 is a cross-sectional view similar to FIG. 1 showing a second embodiment of the present invention.

It should be noted that the foregoing second buffer layer 14 may be eliminated without substantial problem. FIG. 4 shows a second embodiment of the present invention wherein the second buffer layer 14 is eliminated. In FIG. 4, the parts corresponding to the parts already described in the preceding drawings are given identical reference numerals and the description thereof will be omitted.

Even in this structure, the dislocation density in the top GaAs epitaxial layer 12b is reduced substantially below $10^6 cm^{-2}$ as shown in FIG. 3 by solid circles. Similarly to the case of the first embodiment, the optimum thickness of about 6000 Å is observed also in this case for the buffer layer 13, although the dislocation density is slightly increased as compared to the first embodiment.

In the foregoing first and second embodiments, the composition of the InGaAs buffer layer 13 is not limited to $In_{0.1}Ga_{0.9}As$ but other composition may be used. When a different composition is used for the layer 13, the optimum layer thickness which minimizes the dislocation density at the top surface of the GaAs layer 12b is changed accordingly. Further, the strained superlattice structure forming the second buffer layer 25 is not limited to the alternate repetition of $In_{0.05}Ga_{0.95}As$ and GaAs but other combination of materials comprising an alternate repetition of $In_xGa_{1-x}P$ and $In_yGa_{1-y}P$ may be used as long as layers having different lattice constants are stacked alternately.

Next, a third embodiment of the present invention will be described with reference to FIG. 5. In this embodiment, an indium phosphide (InP) epitaxial layer is provided on a silicon substrate as the substrate layer of semiconductor device.

Figure 5:
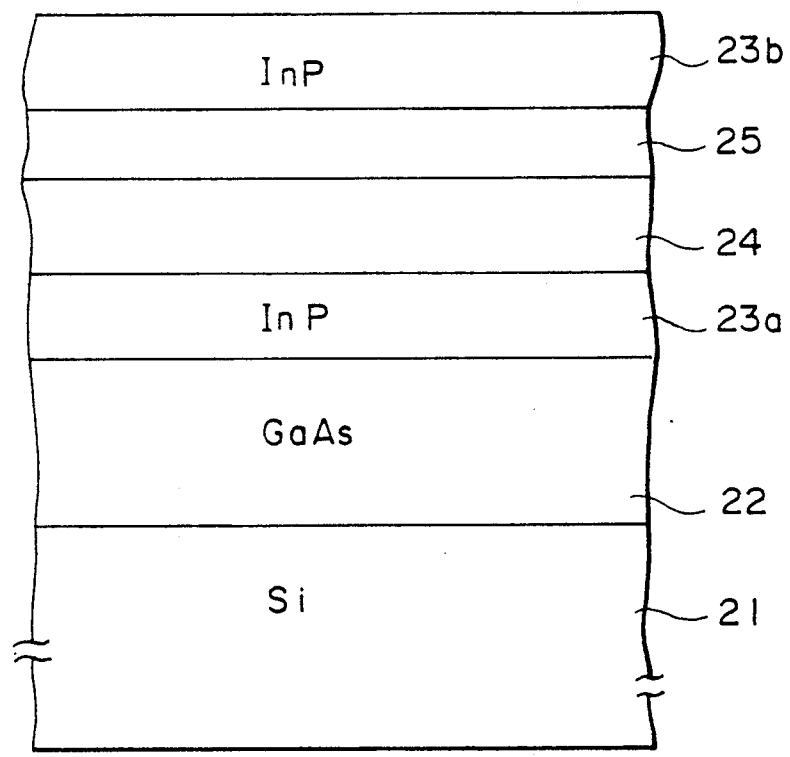
FIG. 5 is a cross-sectional view showing a third embodiment of the present invention.

Referring to FIG. 5, the semiconductor device of this embodiment comprises a silicon substrate 21, a GaAs epitaxial layer 22 grown heteroepitaxially thereon with a thickness of 1.0 μm, an epitaxial layer 23a of InP grown on the layer 22 with a thickness of 0.5 μm, a first buffer layer 24 of indium gallium phosphide (InGaP) having a composition of $In_{0.9}Ga_{0.1}P$ grown on the epitaxial layer 23a with a thickness of 0.3–0.6 μm, a second buffer layer 25 having a strained superlattice structure of $In_{0.9}Ga_{0.1}P$ and InP each having a thickness of about 200 Å with an overall thickness of about 0.2 μm, and an InP epitaxial layer grown further on the second buffer layer 25 as the substrate of the semiconductor device. The illustration of the active device provided on the epitaxial layer 23b is omitted.

In this embodiment, too, the threading dislocations created at the boundary between the silicon substrate 21 and the GaAs layer 22 and the dislocations created at the boundary between the GaAs layer 22 and the InP epitaxial layer 23a are cancelled each other. Further, the threading dislocations extending into the first buffer layer 24 are cancelled in the layer 24 by merging with the dislocations created at the boundary between the layer 23a and the layer 24 similarly to the first embodiment. Further, the dislocations extending further upwards from the first buffer layer 24 are intercepted by the second buffer layer 25 comprising an alternate repetition of InGaP and InP layers. The dislocation density at the top surface of the InP epitaxial layer 23b can be minimized similarly to the first embodiment by optimizing the thickness of the InGaP buffer layer 24 to a thickness of about 300 Å. Thereby, the dislocation density at the top surface of the InP epitaxial layer 23b is minimized and construction of the active devices thereon becomes possible without problem. As the decrease of the dislocation density achieved by the optimization of the thickness of the layer 24 is substantially identical to the relation shown in FIG. 3, further description with respect to the effect of the present embodiment will be omitted.

Further, the buffer layer system of the layer 24 and 25 of FIG. 5 is not limited to the foregoing combination of materials but other materials such as indium gallium phosphide (InGaP) may be used for the first buffer layer 24. Similarly, a superlattice structure comprising an alternate repetition of InGaP and GaP layers may be used as the second buffer layer 25 in combination with any of the foregoing first buffer layers 24.

When the thickness of the first buffer layer 24 is chosen to be about 6000 Å, the optimum composition of the first buffer layer 24 becomes $In_{0.05}Ga_{0.95}P$ when InGaP is used for the layer 24. Further, when a layer of GaAsP is used for the buffer layer 24, the optimum composition becomes about $GaAs_{0.9}P_{0.1}$ when the thickness of the layer 24 is set to about 6000 Å. In other words, when the thickness of the first buffer layer is fixed, the composition of the first layer may be changed so as to minimize the dislocation density at the top surface of the epitaxial layer 23b.

Further, the present invention is not limited to the embodiments described heretofore but various variations and modifications may be made without departing from the scope of the invention.

What is claimed is:

1. A semiconductor device comprising:

a first semiconductor layer comprising a single crystal of a first semiconductor material having a first lattice constant;

a second semiconductor layer comprising a single crystal of a second semiconductor material having a second lattice constant which is different from the first lattice constant;

a third semiconductor layer comprising a third semiconductor material having a third lattice constant which is different from the first lattice constant, said third semiconductor layer being grown heteroepitaxially on the first semiconductor layer;

a fourth semiconductor layer comprising a fourth semiconductor material having a fourth lattice constant which is different from the third lattice constant, said fourth semiconductor layer being grown heteroepitaxially on the third semiconductor layer in a manner such that the second semiconductor layer is provided thereon, for preventing a first group of dislocations created in the third semiconductor layer from reaching the second semiconductor layer after passing through the fourth semiconductor layer, said fourth semiconductor layer having a thickness chosen to be larger than a critical thickness above which thickness a second group of dislocations is created in the fourth semiconductor layer at an interface between the third semiconductor layer and the fourth semiconductor layer as a result of a difference between the third lattice constant and the fourth lattice constant, said thickness of the fourth semiconductor layer being further optimized to an optimum thickness above which thickness and below which thickness there is caused an increase of the dislocation density in the second semiconductor layer; and an active semiconductor device provided on the second semiconductor layer.

2. A semiconductor device as claimed in claim 1 in which said first semiconductor layer comprises silicon, said second and third semiconductor layers comprise gallium arsenide and said fourth semiconductor layer comprises indium gallium arsenide having a composition of $In_{0.05}Ga_{0.95}As$, wherein the thickness of said fourth semiconductor layer is chosen to be in a range of 0.3–0.8 $\mu$m.

3. A semiconductor device as claimed in claim 2 in which said thickness of the fourth semiconductor layer is chosen to be about 0.6 $\mu$m.

4. A semiconductor device as claimed in claim 1 in which said fourth semiconductor layer has a thickness of 0.6 $\mu$m and comprises gallium arsenide phosphide having a composition of $GaAs_{0.9}P_{0.1}$.

5. A semiconductor device as claimed in claim 1 in which said fourth semiconductor layer has a thickness of about 0.5 $\mu$m and comprises indium gallium phosphide having a composition of about $In_{0.9}Ga_{0.1}P$.

6. A semiconductor device as claimed in claim 1 in which said semiconductor device further comprises a fifth semiconductor layer having a strained superlattice structure provided between the second semiconductor layer and the fourth semiconductor layer for preventing the second group of dislocations from reaching the second semiconductor layer after passing through the fourth semiconductor layer.

7. A semiconductor device as claimed in claim 6 in which said fifth semiconductor layer comprises an alternate repetition of a first sub-layer and a second sub-layer of compound semiconductor materials each having respective lattice constants which are different from each other.

8. A semiconductor device as claimed in claim 7 in which said first and second sub-layers forming the fifth semiconductor layer comprise $In_{0.05}Ga_{0.95}As$ and GaAs respectively wherein each of the first and second sub-layers has a thickness of about 200 Å.

9. A semiconductor device as claimed in claim 7 in which said first sub-layer forming the fifth semiconductor layer is selected from a group consisted of aluminum gallium arsenide, indium gallium arsenide, gallium arsenide phosphide and indium gallium phosphide, and said said second sub-layer forming the fifth semiconductor layer is selected from a group consisted of gallium arsenide and gallium phosphide.

10. A semiconductor device as claimed in claim 6 in which said second and third semiconductor layers comprise indium phosphide, said fourth semiconductor layer comprises indium gallium phosphide having a thickness of 0.3 $\mu$m and a composition of $In_{0.9}Ga_{0.1}P$, and said fifth semiconductor layer comprises an alternate repetition of a layer of indium gallium phosphide having a thickness of about 200 Å and a layer of indium phosphide having a thickness of about 200 Å.

11. A semiconductor device comprising:

a first semiconductor layer comprising a single crystal of a first semiconductor material having a first lattice constant;

a second semiconductor layer comprising a second semiconductor material having a second lattice constant which is different from the first lattice constant;

a third semiconductor layer comprising a third semiconductor material having a third lattice constant which is different from the first lattice constant, said third semiconductor layer being grown heteroepitaxially on the first semiconductor layer;

a fourth semiconductor layer comprising a fourth semiconductor material having a fourth lattice constant which is different from the third lattice constant, said fourth semiconductor layer being grown heteroepitaxially on the third semiconductor layer in a manner such that the second semiconductor layer is provided thereon, for preventing a first group of dislocations created in the third semiconductor layer from reaching the fourth semiconductor layer after passing through the fourth semiconductor layer, said fourth semiconductor layer having a thickness chosen to be larger than a critical thickness above which thickness a second group of dislocations are created therein as a result of difference between the third and fourth lattice constants, said fourth semiconductor layer being further chosen to have an optimized composition wherein the dislocation density in the second semiconductor layer is minimized; and an active semiconductor device provided on the fourth semiconductor layer.

* * * * *

UNITED STATES PATENT AND TRADEMARK OFFICE
CERTIFICATE OF CORRECTION

PATENT NO. : 5,019,874

DATED : May 28, 1991

INVENTOR(S) : INOUE et al.

It is certified that error appears in the above-identified patent and that said Letters Patent is hereby corrected as shown below:

Title Page: [75] Inventors, change "Ohmorinishi" to --Tokyo--.

Col. 2, line 50, after "cancelled" insert --by--.

Col. 3, line 52, change "hled" to --held--.

Col. 4, line 58, in the equation change "." to --.-- (both occurrence).

Col. 5, line 55, change "other" to --a different--;
line 62, change "other" to --a different--.

Col. 6, line 22, after "cancelled" insert --by-- .

Col. 8, line 18, delete "said";
line 20, change "consisted" to --consisting--.

Signed and Sealed this

Sixth Day of July, 1993

Attest:

MICHAEL K. KIRK

Attesting Officer    Acting Commissioner of Patents and Trademarks